United States Patent [19]

Haun et al.

[11] Patent Number: 4,728,845
[45] Date of Patent: Mar. 1, 1988

[54] 1-3-0 CONNECTIVITY PIEZOELECTRIC COMPOSITE WITH VOID

[75] Inventors: Michael J. Haun; Robert E. Newnham, both of State College, Pa.

[73] Assignee: The United States of America as represented by the Secretary of the Navy, Washington, D.C.

[21] Appl. No.: 67,845

[22] Filed: Jun. 30, 1987

[51] Int. Cl.$^4$ ............................................. H01L 41/08
[52] U.S. Cl. ...................................... 310/358; 310/357
[58] Field of Search ......................... 310/311, 357–359, 310/800

[56] References Cited

U.S. PATENT DOCUMENTS

| | | | |
|---|---|---|---|
| 4,227,111 | 10/1980 | Cross et al. | 310/358 |
| 4,330,593 | 5/1982 | Shrout et al. | 310/358 |
| 4,407,054 | 10/1983 | Zipfel, Jr. | 310/358 |
| 4,412,148 | 10/1983 | Klicker et al. | 310/358 |
| 4,422,003 | 12/1983 | Safari et al. | 310/358 |
| 4,572,981 | 2/1986 | Zola | 310/358 |
| 4,613,784 | 9/1986 | Haun et al. | 310/358 |
| 4,658,176 | 4/1987 | Nakaya et al. | 310/358 X |
| 4,683,396 | 7/1987 | Takeuchi et al. | 310/358 |

OTHER PUBLICATIONS

M. J. Haun and R. E. Newbam, "Experimental and Theoretical Study of 1-3 and 1-3-0 Piezoelectric PZT-Polymer Composites for Hydrophone Applications", *Ferroelectrics*, vol. 68 (1986), pp. 123–139 (attached).

*Primary Examiner*—Mark O. Budd
*Attorney, Agent, or Firm*—Henry Hansen

[57] ABSTRACT

A composite of PZT (lead zirconate titanate) and a compliant polymer having 1-3-0 connectivity is described. A polymer self-connected in all three mutually perpendicular directions with a void in the center has an array of parallel PZT rod elements embedded therein and extending through the void. The void isolates a region of the PZT rods from the polymer. The axes of the PZT rods are along the direction of the poling electric field. Such an arrangement significantly enhances the hydrostatic piezoelectric charge and voltage coefficients $d_h$ and $g_h$.

4 Claims, 2 Drawing Figures

1-3-0 CONNECTIVITY PIEZOELECTRIC COMPOSITE WITH VOID

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

This invention relates generally to piezoelectric materials, and more particularly to PZT-polymer 1-3-0 phase-connected composites for hydrophone applications.

Hydrophone devices use piezoelectric materials to act as passive listening devices for low frequency acoustic waves, which produce an essentially hydrostatic pressure on the devices. The sensitivity of a hydrophone is determined by the voltage that is produced from this hydrostatic pressure. The hydrostatic piezoelectric voltage coefficient ($g_h$) relates the electric field (voltage/thickness) of a piezoelectric material to the applied hydrostatic stress, and is therefore a useful parameter for evaluating a material for use in a hydrophone. The hydrostatic piezoelectric charge coefficient ($d_h$) relates to the polarization (charge/area) produced from an applied hydrostatic stress. The relationship between $g_h$ and $d_h$ is given by:

$$g_h = d_h / K_{33}\epsilon_0 \qquad \text{Eq. (1)}$$

where $K_{33}$ is the dielectric constant in the $x_3$ direction (the poling direction), and $\epsilon_0$ is the permittivity of free space. A large charge coefficient $d_h$ and low dielectric constant $K_{33}$ are desired so the hydrophone material may have a large voltage coefficient $g_h$ and thus have high sensitivity. The product of $d_h$ and $g_h$ is often used as the figure of merit of a material for use in hydrophone applications.

In addition to having large $d_h$ and $g_h$ coefficients, there are other desirable hydrophone material characteristics. The piezoelectric element within the device should be acoustically impedance-matched to water, should have high compliance for resistance to mechanical shock from pressure fluctuations, and should be flexible if the device is to be mounted on the hull of a ship.

Lead zirconate titanate (PZT) has traditionally been used for hydrophone devices, but it does not have many of the desired qualities. Piezoelectric composites of PZT and a polymer have been fabricated to combine the desirable properties of each phase. The PZT supplies the piezoelectric activity of the composite, while the polymer lowers the dielectric constant $K_{33}$ and density, and adds flexibility. Through the proper selection of the connectivity and properties of these phases, the $d_h$ coefficient can be enhanced. By replacing most of the PZT (high $K_{33}$) with a polymer (low $K_{33}$), the dielectric constant can be significantly reduced, resulting in an enhanced $g_h$ coefficient.

One type of connectivity pattern that has been particularly successful is the 1-3 composite with PZT rods aligned in the poling direction ($x_3$ direction) held together by a polymer matrix. In the notation 1-3, one (1) refers to the one-dimensionally connected PZT phase and the three (3) refers to the three-dimensionally connected polymer phase. The stiffer PZT rods support most of an applied stress in their direction of alignment, the $x_3$ direction, because of the parallel connection with the more compliant polymer phase. Hence, the $d_h$ coefficient for a 1-3 composite can be increased compared to its low value for single-phase PZT.

Porosity has been added to the matrix to allow it to be compressible. 1-3-0 connectivity notation has traditionally been used to describe a 1-3 composite with a porous polymer matrix (i.e. polymer in the form of a foam). The 0 refers to the polymer porosity, which is not connected in any orthogonal direction through the composite. With the addition of porosity, the internal stresses are decreased, which enhances the $d_h$ coefficient. However, at high pressures, the small voids collapse and the enhanced effect is lost.

SUMMARY OF THE INVENTION

An object of the present invention is to provide a PZT-polymer composite for hydrophone applications. Another object is to provide such a composite which has high hydrostatic piezoelectric voltage and charge coefficients $g_h$ and $d_h$. Other objects include providing a composite hydrophone material which remains afloat while being towed in the form of an array, and is compliant and flexible.

Briefly, these and other objects are accomplished by a PZT-polymer composite of 1-3 connectivity having a void in the center thereof. A square array of parallel PZT rods extends through the matrix and void, parallel to the poling direction, so that a portion of each rod is isolated from the surrounding matrix. This configuration shall be denoted as 1-3-0 connectivity, where in this case the "0" represents the void.

Other objects, advantages, and novel features of the invention will become apparent from the following detailed description of the invention when considered in conjunction with the accompanying drawings wherein:

DESCRIPTION OF THE PREFERRED EMBODIMENT

Figure 1:
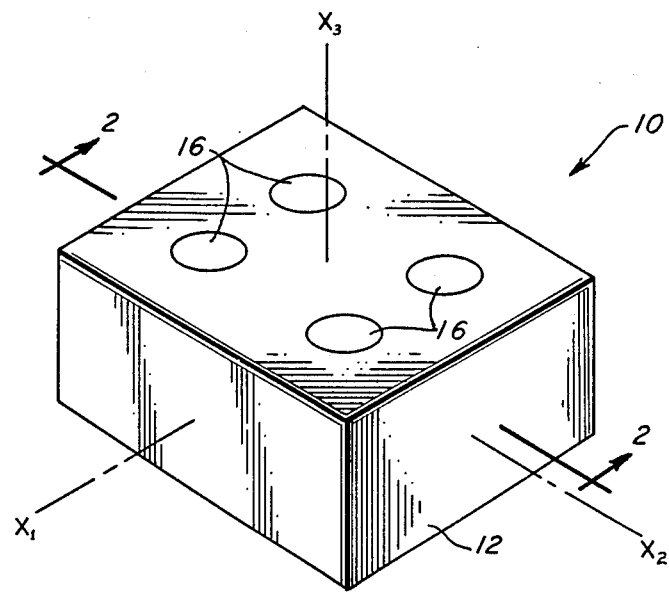
FIG. 1 is an isometric representation of a 1-3-0 PZT-polymer composite according to the invention.
Figure 2:
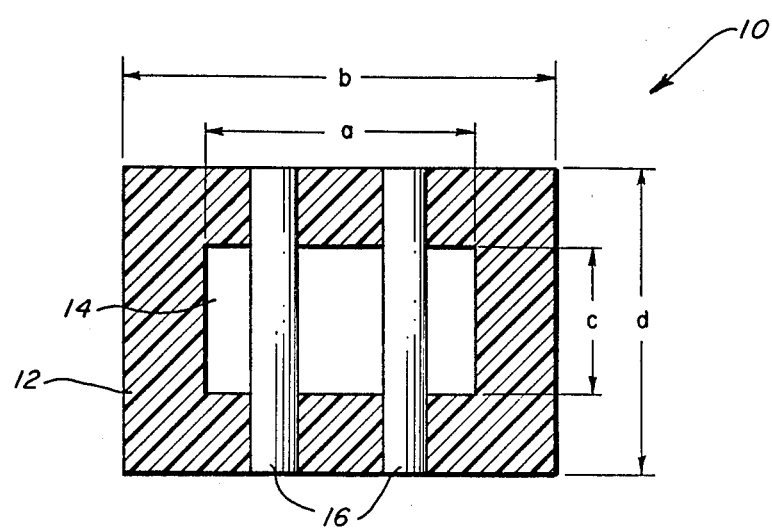
FIG. 2 is a cross-sectional view of the invention taken along the line 2—2 of FIG. 1.

Referring now to the drawings wherein like characters designate like or corresponding parts throughout the several views, there is shown in FIG. 1 and FIG. 2 a composite 10 of PZT and a polymer according to the present invention. Orthogonal axes $x_1$, $x_2$, and $x_3$ are shows as a reference for direction. Polymer 12 forms a matrix including a void 14 in the center. A plurality of PZT rods 16 are embedded in polymer 12 parallel to the $x_3$ axis, each rod extending through void 14 so that each rod has a region isolated from polymer 12.

The PZT rods 16 may be manufactured as described in U.S. Pat. No. 4,412,148 to Klicker et al. at col. 2, lines 39 to 59.

To make composite 10, alignment racks (not shown) are made from two 1.8 cm diameter brass discs with a square array of holes drilled in each. The two discs are bolted together so that PZT rods 16 can be passed through corresponding holes aligning the rods in place. The alignment racks are suspended over molds, which are filled with an epoxy and cured. This forms a base to hold PZT rods 16 in place so that the brass racks can be removed.

Five additional steps are used to form void 14 in the center of composite 10. The epoxy base described above is used as one of the six sides surrounding void 14. The next side is formed by suspending the epoxy base perpendicular to a mold with PZT rods 16 parallel to the mold. The mold is then filled with epoxy and cured. The remaining sides are made in four similar steps by rotating the structure ninety degrees to the previous orientation and again suspending the structure over a mold, which is then filled with epoxy and cured. The result is a right rectangular parallel-biped-shaped matrix of polymer 12, with a void 14 of the same shape in the middle (although not necessarily of the same proportions), and a plurality of parallel PZT rods 16 in a square array through polymer 12 and void 14 in the $x_3$ direction. The composites tested had a 29 percent void, with the square array of PZT rods 16 covering a smaller area than void 14, the rods making up one percent of the total composite.

Composite 10 is then polished, and air-dry silver is applied to the faces perpendicular to the $x_3$ direction to act as electrodes (not shown).

Composite 10 is then poled in the $x_3$ direction in a 70° C. oil bath with a field of 14 KV/cm applied for five minutes. After aging for at least 24 hours, the dielectric and piezoelectric properties can be measured.

As previously discussed, a composite for use as a hydrophone device should have high values of $g_h$ and $d_h$. The 1-3 and traditional 1-3-0 (foamed matrix) composites achieve higher $g_h$ and $d_h$ values compared to single phase PZT. The basic idea of a 1-3 composite is to reduce the $d_{31}$ coefficient relative to the $d_{33}$ coefficient, while also decreasing the dielectric constant. This is because the relationship between $d_h$, $d_{33}$, and $d_{31}$ is expressed by:

$$d_h = d_{33} + 2d_{31} \qquad \text{Eq. (2)}$$

and $d_{31}$ is negative for the PZT material used. The $d_{31}$ coefficient is the piezoelectric hydrostatic charge coefficient for the composite (poled in the $x_3$ direction) when a stress is applied parallel to the $x_1$ (or $x_2$) axis. The $d_{33}$ coefficient is the charge coefficient for the composite (poled in the $x_3$ direction) when a stress is applied in the $x_3$ direction. When a hydrostatic stress is applied to a 1-3 composite, the stiff PZT rods support most of the stress in the $x_3$ direction. This results in a large longitudinal stress on the PZT, substantially greater than the applied stress.

In a 1-3-0 foamed matrix composite the stress is even further amplified. Adding porosity to a 1-3 composite allows the PZT rods to support a greater fraction of the applied stress in the $x_3$ direction, thereby increasing the $d_{33}$ coefficient. The addition of porosity decreases the $d_{31}$ coefficient because of two effects: the area of PZT exposed to an applied stress in the $x_1$ direction is reduced, and the internal stress on the PZT in the $x_3$ direction caused by the mismatch in the compliance coefficients of the PZT and polymer is decreased. Hydrostatic piezoelectric sensitivity is therefore enhanced by porosity.

The present invention introduces a single void 14 into the center of the matrix of polymer 12, as described, even further improving the desired properties. Each PZT rod 16 extends through void 14, isolating it entirely from polymer 12 which reduces the area of the PZT rod exposed to $x_1$ stress, thereby increasing $d_h$. So whereas a foamed matrix 1-3-0 composite minimizes the stresses in the $x_1$ and $x_2$ directions, the 1-3-0 void composite eliminates them within the section of void 14.

Experimentation indicates that a composite according to the present invention does yield a product with enhanced qualities for hydrophone applications. The improvement is best seen in Table I which shows a comparison of the results obtained by testing a 1-3-0 composite with a void and a 1-3 composite cut from the same set of PZT rods.

TABLE I

Comparison between the experimental results for a 1-3 composite and a composite of the present invention (1-3-0 composite with 29 percent void)

| Coefficient | 1-3 Composite | 1-3-0 Composite (29% Void) |
|---|---|---|
| $K_{33}$ | 22 | 24 |
| $d_{33}$ (pC/N) | 217 | 255 |
| $d_h$ (pC/N) | 10 | 63 |
| $g_h$ (× $10^{-3}$ Vm/N) | 52* | 295* |
| $d_h g_h$ (× $10^{-15}$ m²/N) | 520 | 18,600 |

*Measured at 100 psi (0.69 MPa) and 50 Hz.
The $d_{33}$ coefficients represent averages of $d_{33}$ measurements made only over the PZT rod section of the samples. The values of $K_{33}$, $d_h$, $g_h$, and $d_h g_h$ were determined for the total area of the samples.

The $d_{33}$ coefficient was measured dynamically using a Berlincourt Piezo $d_{33}$-meter with the electromagnetic driver operating at a frequency of 100 Hz. Twenty five $d_{33}$ measurements were made on each sample using single-point probes, and the average was used as the $d_{33}$ coefficient of the composite.

The $g_h$ coefficient was determined by using an electromagnetic driver as an A.C. stress generator to apply pressure waves to the sample and a PZT standard, which are also under a static pressure from the hydraulic press. The charges produced from the sample and standard were buffered with an impedance convertor, and the voltages produced were measured on a Hewlett-Packard 3585A Spectrum Analyzer. The ratio of the voltages produced is proportional to the $g_h$ coefficients. By accounting for the sample geometries and the stray capacitance of the holders, the $g_h$ coefficient of the sample was calculated.

Although a 29 percent void was used for the tests, the void size may vary as may the proportions. FIG. 2 represents with letters the relative proportions of the dimensions of composite 10 and void 14. The ratio of the thickness of void 14 to the thickness of composite 10 is $t = c/d$. The ratio of the widths of the two is $w = a/b$. The $d_{33}$ coefficient of the composite is dependent on the thickness ratio of the void, and independent of the width ratio. The $d_{31}$ coefficient depends more on the thickness ratio than on the width ratio. The opposite is true for the $d_h$ coefficient, which depends more on the width ratio than the thickness ratio. Thus a void elongated in the $x_1$ direction would be more advantageous in enhancing hydrostatic sensitivity.

Some of the many features and advantages of the invention should now be readily apparent. Composites with voids show significant enhancements in the hydrostatic coefficients $d_h$ and $g_h$ compared to the same composites without voids. The $d_h g_h$ figure of merit increased by factors of 6 to 80 times with the addition of the void. Electrical impedance is low due to small percentage of PZT in the composite. A lower density composite has been provided, as well as a more flexible and compliant one, making it ideal for hydrophone applications.

For a more detailed discussion see M. J. Haun and R. E. Newnham, "An Experimental and Theoretical Study of 1-3 and 1-3-0 Piezoelectric PZT-Polymer Composites for Hydrophone Applications", *Ferroelectrics,* Vol. 68 (1986) pp. 123–139.

Other embodiments and modifications of the present invention may readily come to those of ordinary skill in the art having the benefit of the teachings presented in the foregoing description and drawings. For instance, the diameter of the PZT rods may vary, as may the distance between rods, or the shape of their array. The size and shape of the void may vary, increasing the size resulting in increased sensitivity but reduced physical stability. Also, a different matrix material having similar density and flexibility may be used. Other techniques for manufacturing the PZT rods may be employed. Therefore, it is to be understood that the present invention is not to be limited to such teachings presented, and that such further embodiments and modifications are intended to be included within the scope of the appended claims.

What is claimed is:
1. A PZT-polymer composite of 1-3-0 connectivity comprising:
   a matrix of a polymer containing a void in the center thereof;
   a plurality of PZT rods embedded in said matrix and extending through the void, each member of said plurality of PZT rods having its longitudinal axis aligned in the same direction; and
   means for polarizing the composite with a field parallel to the axes.
2. The PZT-polymer composite of claim 1 further comprising silver electrodes on opposite surfaces thereof, said opposite surfaces being generally perpendicular to the axes.
3. The PZT-polymer composite of claim 1 wherein the polymer is an epoxy.
4. The PZT-polymer composite of claim 1 wherein:
   the composite and the void are right rectangular parallel-biped configurations; and
   said plurality of PZT rods are arranged in a rectangular array.

* * * * *